United States Patent [19]

Koel et al.

[11] 4,176,016

[45] Nov. 27, 1979

[54] FORMING ELECTRICALLY INSULATING LAYERS BY SPUTTER DEPOSITION

[75] Inventors: Gerrit J. Koel; Lambertus Postma, both of Eindhoven, Netherlands

[73] Assignee: U.S. Philips Corporation, New York, N.Y.

[21] Appl. No.: 877,167

[22] Filed: Feb. 13, 1978

[30] Foreign Application Priority Data

Feb. 15, 1977 [NL] Netherlands .......................... 7701559

[51] Int. Cl.² ............................................. C23C 15/00
[52] U.S. Cl. ............................... 204/38 R; 204/192 EC
[58] Field of Search ..................... 204/192 EC, 192 E

[56] References Cited

U.S. PATENT DOCUMENTS

| 3,804,738 | 4/1974 | Lechaton et al. ............. 204/192 EC |
| 3,983,022 | 9/1976 | Auyang et al. ................ 204/192 EC |
| 4,022,930 | 5/1977 | Fraser ..................................... 427/99 |

Primary Examiner—Anthony Skapars
Assistant Examiner—William Leader
Attorney, Agent, or Firm—Thomas A. Briody; Edward J. Connors, Jr.; Paul R. Miller

[57] ABSTRACT

A method of making inclined sides on a metal pattern which is grown on a substrate by electroplating as a preliminary measure to the coating of the substrate with the metal pattern by an insulating layer. The main deposition of the insulating layer by sputtering is preceded by a sputter-etching step which transforms the rounded edges of the metal pattern into inclined sides.

5 Claims, 9 Drawing Figures

FORMING ELECTRICALLY INSULATING LAYERS BY SPUTTER DEPOSITION

The invention relates to a method of manufacturing a device in which at a certain stage of manufacture an electrically insulating layer is formed on a substrate bearing a metal pattern projecting above the surface of the substrate, the method comprising the step of growing the metal pattern on the substrate by electrodeposition and producing the electrically insulating layer by means of a sputter process.

Such a method is disclosed in U.S. Pat. No. 3,755,123.

In the manufacture of devices like semiconductor devices, magnetic bubble devices and thinfilm magnetic heads, by a method in which an insulating layer is provided by means of sputtering over a metal pattern which is grown on a substrate by electrodeposition, the insulating layer follows the contours of the metal pattern.

However, it is difficult for the insulating layer to assume the relief of the underlying surface in such manner that the thickness of the insulating layer is everywhere uniform. This is the case notably with the upright edges of the metal pattern where the coating by the insulating layer is usually considerably thinner than that in flat areas (i.e. areas substantially parallel to the substrate). In order nevertheless to give the edges a sufficient coating it is necessary to ensure that the thickness of the insulating layer over the flat areas is much larger than is actually necessary. Dependent on the height of the metal pattern it is usual, for example, to make the insulating layer over the flat areas one and a half times as thick as the metal pattern itself.

It is the object of the invention to provide a method of the kind mentioned in the preamble which enables a homogeneous insulating layer to be made having a thickness which is as small as possible.

For that purpose, the method according to the invention is characterized in that during a first stage of the sputtering deposition process a sputter-etching step is simultaneously performed at a rate which removes both electrically insulating material sputtered onto the edges of the metal pattern and electrodeposited metal at the edges and sides of the metal pattern so as to produce sides of the metal pattern which are inclined with respect to the substrate surface, but which rate of sputter-etching p is just not sufficient to entirely remove the electrically insulating material sputtered on to the surface of the metal pattern which is substantially parallel to the surface of the substrate, the sputter etching step then being terminated and during a second step of the sputter deposition process the sputtering of the electrically insulating layer being continued until the layer has a desired thickness.

The invention is based on the fact that the insulating layer is sputtered in such circumstances that very little insulating material deposits on the flat areas. That is to say: the quantity of material which is sputtered is removed nearly entirely by sputter-etching, while on the edges the sputter-etching effect predominates so that no insulating material is deposited there and sputter-etching of the edge of the metal pattern takes place so that the edge profile produced by the electrodeposition, which is originally more or less rounded, is changed so as to become inclined to the substrate surface. As soon as a slope having the desired inclination is obtained, sputter-etching is discontinued and only sputtering is continued and, due to the resulting gradual transition from metal pattern to substrate, a homogeneous layer of electrically insulating material is formed. The thickness of this layer may be considerably smaller than the thickness of insulating layers which are provided over a metal pattern by conventional methods, that is to say; while maintaining the original edge profile forming a step-like transition. The method according to the invention may be used advantageously in particular at those areas where thin insulating layers are necessary, for example, the transmission gap in a thin-film magnetic head.

The use of the method according to the invention may present great advantages in other cases also. It has been found that even in structures where the provision of a thick insulating layer over a metal pattern can be permitted, the round variation of the edge of the metal pattern involves an obvious drawback when an interconnection hole to an underlying metal strip has to be formed through the insulating layer, as is the case, for example, in multilayer structures. When a hole is etched checmically in the usual manner through such a thick electrically insulating layer provided over a metal strip, the hole will reach the edge of the metal strip and possibly even the lower side thereof before all the insulating material above the metal strip has been removed. During the time that the remainder of the insulating layer above the metal strip at the area of the hole is removed, an undesired attack by the etchant along the side of the metal pattern will take place, as a result of which an undesired gap is formed which not only means a weak spot in the structure but in addition involves the danger that in subsequent etching steps a short-circuit path may be formed which connects the metal strip to the (semi-conductor) substrate through the insulating layer therebelow. The "gap corrosion" is obviously due to a preferential etching phenomenon along the edge of the metal strip.

The above-described problem occurs notably in multilayer structures in which the interconnection hole is wider than the underlying metal strip.

The present-day integrated circuits often have a metal pattern in which the metal strips are situated very close together. They hence require interconnection holes which are at least as wide as and are preferably wider than the metal strips over which they are disposed. In prior art less dense edge structures it was usual to have wider portions of the metal strip below the interconnection holes. Since in such a case the edge of the underlying metal strips could not be attacked by the etchant, there would be little chance of the occurrence of gap corrosion. However, in present-day integrated circuits having very densely packed metal strips, the provision of such widenings below the interconnection holes is not practical since it restricts the density of the packing. In the present-day metal patterns the metal strips are hence preferably not wider than the holes and it is even desirable to make the holes wider than the underlying metal strips in order to ensure, even in the case of possible errors in the alignment upon making the hole, that the interconncetion hole contacts the metal strip.

Within the scope of the invention it is now possible to make this type of hole without difficulty since it is ensured upon sputtering the insulating layer that the metal strips are given inclined sides. Interconnection holes may be formed in the electrically insulating layer by chemical etching.

The advantage of the inclined sides of the metal strips is that during etching of the holes the insulating material is etched away uniformly so that no gap corrosion occurs.

This method permits in particular the etching of interconnection holes which are at least as wide as the underlying part of the metal pattern and, in the case in which the parts of the metal pattern are situated so closely together that no space is available to provide two holes one beside the other, the method even makes it possible to form one interconnection hole above at least two juxtaposed parts of the metal pattern without difficulty.

In order to be able to perform the sputter-etching step necessary for manufacture of the inclined sides, the sputter step whereby the electrically insulating material is deposited on the substrate should be carried out by supplying the substrate with a certain bias voltage. The bias voltage is not very critical, but it is preferably between 35 and 45 percent of the voltage on the sputtering electrode. Using bias percentages above 45, the metal pattern is ultimately sputtered away entirely, while in using bias percentages below 35 an ever increasing part of the edge profile is covered with insulating material, and is hence not sputtered away. When using a bias percentage of approximately 40 the desired slope is formed on the edges of the metal pattern, the bias is reduced so as to sputter the insulating material to the desired thickness. If desired, sputtering may be carried out at such a low bias percentage (for example 10 to 20%) that an insulating layer is obtained having insulating and etching properties, respectively, which can be controlled accurately.

The angles of inclination of the sides of the metal pattern to the subjacent substrate are preferably 30° to 50°. In the case of angles of inclination which are smaller than approximately 30°, too much material is removed from the metal strip. In the case of angles of inclination which are larger than approximately 50°, the transition from substrate to metal pattern is no longer sufficiently uniform ("the slope becomes too steep"), so that similar problems will occur in the uniform coating as when using the known method.

Some embodiments of the invention will now be described with reference to the accompanying drawings.

Figure 1:
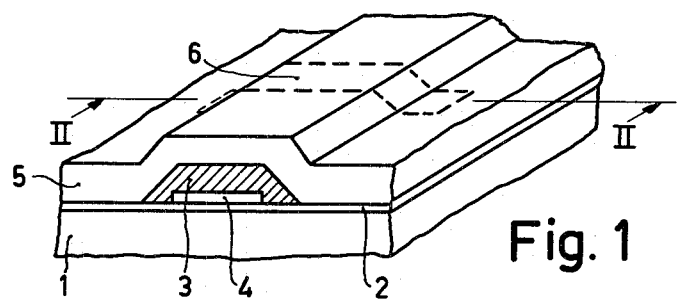
FIG. 1 is a partly perspective sectional elevation of a part of a device.

The structure shown in FIG. 1 is a part of an integrated circuit chip and shows the effect which a metal strip of a metal pattern has on the contours of an insulating layer provided over the metal pattern. As will be explained hereinafter, the structure has been formed by means of conventional integrated circuit technologies while using the method according to the invention. An oxide layer 2 has been formed on the substrate 1, in the present case a silicon substrate, by means of thermal oxidation of the surface of the substrate 1. The oxide layer 2 serves both as a protecting or passivating layer for the silicon substrate, and as an insulating layer which insulates the substrate from a metal pattern of which a metal strip 3 forms a part. The metal pattern has been grown by electroplating on a plating base 4 and is covered with a layer 5 of insulating material, for example, silicon dioxide. Because it is necessary to make the metal pattern accessible in certain places from the top so as to be able to connect it to a further part of the integrated circuit, for example, to a metal pattern to be provided on a second level over the layer 5, interconnection holes have to be provided through the layer 5. Such an interconnection hole ("through hole") 6 is shown in broken lines in FIG. 1.

Figure 2:
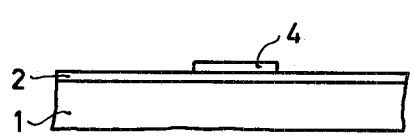
FIGS. 2 to 7 are sectional elevations through the line II—II in FIG. 1 of a device during various stages of the manufacture so as to illustrate the method according to the invention.
Figure 3:
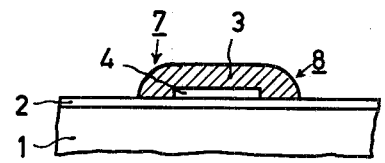
Figure 4:
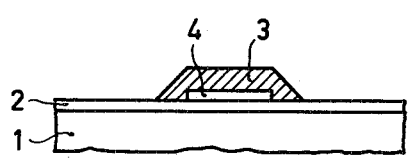

When the layer 5 has been formed by means of conventional deposition methods, the etching of the hole 6 by means of an etchant gives rise to gap corrosion, in particular when the hole is as wide as or is wider than the width of the metal strip 3. The method according to the invention which prevents gap corrosion will be described in detail with reference to FIGS. 2 to 7. A thin plating base 4 is sputtered or vapour-deposited on silicon substrate 1 bearing oxide layer 2 (FIG. 2). The material of the plating base is, for example, MoAu, the Mo ensuring a readily adhering layer and the Au ensuring a readily conductive layer which may serve as an electrode. The overall thickness of the plating base is approximately 0.2 $\mu$m. The plating base is then etched into the shape of the desired metal pattern, denoted by reference numeral 4, by means of photoetching methods. The metal pattern may, for example, have the shape of a flat coiled conductor which is to serve as a coil in a thin-film magnetic head, or the shape of a part of a magnetic circuit of a thin-film magnetic head. (The required shape may also be produced by so-called "lift off" methods and sputter-etching, while maintaining the definition.) The plating base 4 is so thin that the effect of undercutting is substantially negligible. A metal layer 3 is grown electrolytically on the metal pattern 4 to a thickness of 2.5 $\mu$m from a bright copper bath (FIG. 3). Because the lateral growth of the copper across the substrate surface occurs as rapidly as the growth in the direction at right angles to the surface, the layer 3 has rounded edges 7 and 8. An electrically insulating silicon dioxide layer is then formed over layer 3. However, when silicon dioxide is sputtered in the usual manner over a metal layer having rounded edges, constrictions occur which may give rise to interrupted metal layers and shortcircuits, when the silicon dioxide layer is not very thick. But even a thick silicon dioxide layer having no constrictions and formed over a metal pattern still gives the problem of gap corrosion upon etching holes. According to the invention, the silicon dioxide is sputtered in such manner that during the first phase of the sputtering very little silicon dioxide is deposited on flat areas and that on the edges of the layer 3 sputter-etching of the copper occurs so that inclined sides are produced (FIG. 4).

Figure 5:
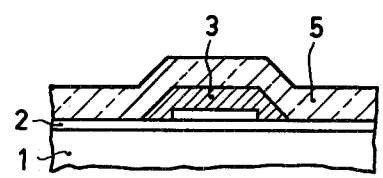
Figure 6:
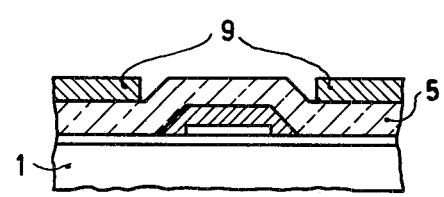
Figure 7:
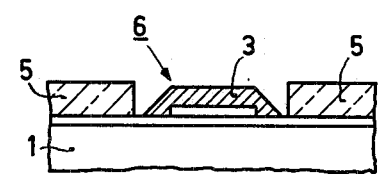

After sputtering SiO$_2$ in a sputtering apparatus for 60 minutes in which the layer 3 was at a (negative) voltage which was 40% of the voltage on the sputtering electrode (=40% bias) an angle of inclination of approximately 40° is obtained. The consumed power is 0.5 kW, and the argon pressure in the sputtering space is 20 mTorr. A layer of silicon dioxide 5 is then sputtered to the desired thickness (2 $\mu$m) (FIG. 5). A negative bias of 10% is applied during this second stage of the composite sputter process, but this second stage may be performed without a bias. While using a mask 9 (FIG. 6) a hole 6 is chemically etched in the layer 5 and exposes the layer 3. As a result of the inclined sides of the layer 3, no gap corrosion occurs (FIG. 7).

Figure 8:
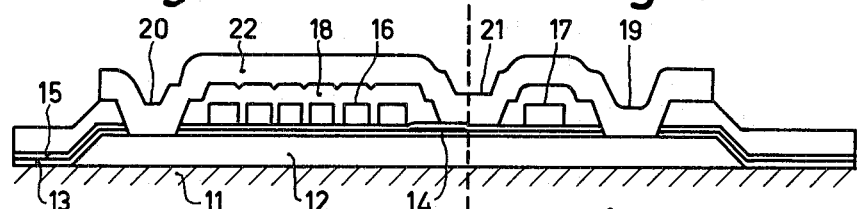
FIG. 8 is a sectional elevation of a thin-film magnetic head.

It is to be noted that the method according to the invention is suitable both for manufacture of structures in which an interconnection hole has to be provided through an insulating layer (as shown in FIGS. 2-7), and also for manufacture of structures in which a hole is to be provided so as to locally reduce the thickness of the insulating layer. This latter is the case, for example, in thin-film magnetic heads when the length of the effective gap has to be adjusted. In order to illustrate this, FIG. 8 is a diagrammatic cross-sectional view through a thin-film magnetic head comprising a substrate 11; a first layer of nickel-iron 12; layers of silicon dioxide 13, 15, 18; a magneto-resistive element 14; a flat coil having six turns 16; a conductor 17; interconnection holes 19, 20; a hole 21 for adjusting the gap length; a second layer of nickel-iron 22; and a front face of the head after polishing dd'.

Figure 9:
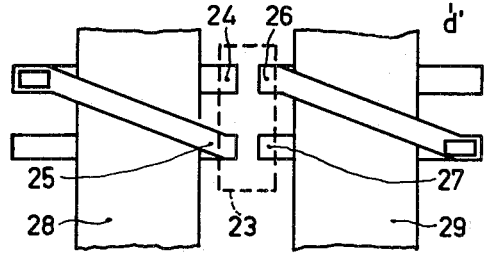
FIG. 9 is a diagrammatic plan view of a winding configuration in a thin-film magnetic head manufactured by means of the method according to the invention.

FIG. 9 shows an interconnection hole 23 (shown in broken lines) with which a number of parts 24, 25, 26, 27 of one metal pattern are simultaneously exposed for interconnection in a densely packed structure. The parts having reference numerals 28 and 29, for example, denote parts of magnetic circuits of thin-film magnetic heads around which electrical turns are provided.

What is claimed is:

1. A method of manufacturing an electrical device in which at a certain stage of the manufacture an electrically insulating layer is formed on the surface of a substrate bearing a metal pattern projecting above said substrate surface, said method comprising the step of growing the metal pattern on the substrate by electrodeposition and producing the electrically insulating layer by means of a two-stage sputter deposition process, characterized in that during the first stage of the sputter deposition process, a sputter-etching step is simultaneously performed at a rate which removes both electrically insulating material sputtered on to the edges of the metal pattern and electrodeposited metal at the edges and sides of the metal pattern so as to produce sides of said metal pattern which are inclined with respect to the substrate surface, but which rate of sputter-etching is just not sufficient to entirely remove the electrically insulating material sputtered on to the surface of the metal pattern which is substantially parallel to said surface of the substrate, the sputter etching step then being terminated and during the second stage of the sputter deposition process the sputtering of the electrically insulating layer being continued until said layer has a desired thickness.

2. A method as claimed in claim 1, wherein interconnection holes are formed in the electrically insulating layer by chemical etching.

3. A method as claimed in claim 2, characterized in that the interconnection holes are at least as wide as the underlying part of the metal pattern.

4. A method as claimed in claim 2 or claim 3, characterized in that one interconnection hole is formed above at least two juxtaposed parts of the metal pattern.

5. A method as claimed in claim 1 or claim 2, characterized in that during the first stage of the sputtering process the substrate is negatively biased at a voltage which is from 35 to 45% of that of the sputtering electrode.